(12) United States Patent
Yang et al.

(10) Patent No.: US 7,590,920 B2
(45) Date of Patent: Sep. 15, 2009

(54) REDUCED COMPLEXITY ERROR CORRECTION ENCODING TECHNIQUES

(75) Inventors: Shaohua Yang, San Jose, CA (US);
Mario Blaum, San Jose, CA (US);
Richard Leo Galbraith, Rochester, MN (US); Ksenija Lakovic, San Jose, CA (US); Yuan Xing Lee, San Jose, CA (US); Travis Oenning, Rochester, MN (US); Jongseung Park, Rochester, MN (US); Hideki Sawaguchi, Sunnyvale, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 588 days.

(21) Appl. No.: 11/198,943

(22) Filed: Aug. 5, 2005

(65) Prior Publication Data
US 2007/0043997 A1 Feb. 22, 2007

(51) Int. Cl.
*H03M 13/00* (2006.01)
(52) U.S. Cl. .................................. 714/774; 714/779
(58) Field of Classification Search ................ 714/774, 714/779
See application file for complete search history.

(56) References Cited

U.S. PATENT DOCUMENTS

| | | | | |
|---|---|---|---|---|
| 4,451,919 A | * | 5/1984 | Wada et al. | 714/758 |
| 4,544,950 A | * | 10/1985 | Tu | 348/485 |
| 4,604,747 A | * | 8/1986 | Onishi et al. | 714/755 |
| 5,136,592 A | * | 8/1992 | Weng | 714/762 |
| 5,355,412 A | * | 10/1994 | Kangas | 713/161 |
| 5,436,918 A | * | 7/1995 | Kato et al. | 714/795 |
| 5,463,762 A | * | 10/1995 | Morrissey et al. | 714/49 |
| 5,815,514 A | * | 9/1998 | Gray | 714/775 |
| 5,931,968 A | * | 8/1999 | Gray | 714/806 |
| 6,081,919 A | * | 6/2000 | Fujiwara et al. | 714/755 |
| 6,081,921 A | * | 6/2000 | Simanapalli | 714/786 |
| 6,141,787 A | * | 10/2000 | Kunisa et al. | 714/769 |
| 6,363,512 B2 | * | 3/2002 | Gray | 714/771 |
| 6,397,367 B1 | * | 5/2002 | Park et al. | 714/786 |
| 6,415,398 B1 | * | 7/2002 | Kikuchi et al. | 714/701 |
| 6,501,748 B1 | * | 12/2002 | Belaiche | 370/342 |
| 6,513,139 B2 | * | 1/2003 | Gray | 714/771 |
| 6,513,141 B1 | | 1/2003 | Livingston | |
| 6,530,057 B1 | * | 3/2003 | Kimmitt | 714/758 |
| 6,581,178 B1 | * | 6/2003 | Kondo | 714/758 |
| 6,625,762 B1 | * | 9/2003 | Le Dantec | 714/701 |
| 6,662,338 B1 | | 12/2003 | Rezzi et al. | |

(Continued)

OTHER PUBLICATIONS

U.S. Appl. No. 11/198,945, filed Aug. 5, 2005, Yang et al.

(Continued)

*Primary Examiner*—Joseph D Torres
(74) *Attorney, Agent, or Firm*—Steven J. Cahill

(57) ABSTRACT

An error correction encoder inserts redundant parity information into a data stream to improve system reliability. The encoder can generate the redundant parity information using a composite code. Dummy bits are inserted into the data stream in locations reserved for parity information generated by subsequent encoding. The error correction code can have a uniform or a non-uniform span. The span corresponds to consecutive channel bits that are within a single block of a smaller parity code that is used to form a composite code. The span lengths can be variant across the whole codeword by inserting dummy bits in less than all of the spans.

10 Claims, 4 Drawing Sheets

U.S. PATENT DOCUMENTS

| | | | |
|---|---|---|---|
| 6,708,308 | B2 | 3/2004 | De Souza et al. |
| 6,757,117 | B1 | 6/2004 | Livingston |
| 6,757,122 | B1 | 6/2004 | Kuznetsov et al. |
| 6,763,495 | B2 * | 7/2004 | Suzuki et al. ............ 714/781 |
| 6,766,489 | B1 * | 7/2004 | Piret et al. ............ 714/755 |
| 6,820,228 | B1 * | 11/2004 | Keller ............ 714/757 |
| 6,888,897 | B1 | 5/2005 | Nazari et al. |
| 6,910,172 | B2 * | 6/2005 | Hara et al. ............ 714/757 |
| 6,934,902 | B2 * | 8/2005 | Hara et al. ............ 714/757 |
| 7,162,678 | B2 * | 1/2007 | Saliba ............ 714/758 |
| 2002/0147954 | A1 | 10/2002 | Shea |
| 2003/0033570 | A1 | 2/2003 | Khannanov et al. |
| 2003/0043487 | A1 | 3/2003 | Morita et al. |
| 2003/0074626 | A1 | 4/2003 | Coker et al. |
| 2003/0174426 | A1 | 9/2003 | Akamatsu |
| 2004/0064777 | A1 | 4/2004 | Kurtas et al. |
| 2004/0187066 | A1 | 9/2004 | Ichihara et al. |
| 2004/0201503 | A1 | 10/2004 | Han et al. |
| 2004/0205383 | A1 | 10/2004 | Sawaguchi |
| 2005/0062623 | A1 | 3/2005 | Lee et al. |
| 2005/0066261 | A1 | 3/2005 | Morita et al. |

OTHER PUBLICATIONS

Panu Chaichanavong, et al., "A Tensor Product Parity Code for Magnetic Recording," Center for Magnetic Recording Research, University of California, San Diego, Jul. 21, 2004, pp. 1-25.

Panu Chaichanavong, et al., "Combining a Tensor-Product Parity Code with a Constrained Code," Center for Magnetic Recording Research, University of California, San Diego, Mar. 1, 2005, pp. 1-33.

Panu Chaichanavong et al., "A Tensor Product Parity Code for Magnetic Recording," CMRR Report, Summer 2004, pp. 4-5.

Panu Chaichanavong, et al., "A Tensor Product Parity Code for Magnetic Recording," http://vivaldi.ucsd.edu:8080/starpapers/Chaichanavong-UP04.pdf, pp. 1-3.

Roy D. Cideciyan, et al., "Noise Predictive Maximum Likelihood Detection Combined with Parity-Based Post-Processing," IEEE Transactions on Magnetics, vol. 37, No. 2, Mar. 2001, pp. 714-720.

Thomas Conway, "A New Target Response with Parity Coding for High Density Magnetic Recording Channels," IEEE Transactions on Magnetics, vol. 34, No. 4, Jul. 1998, pp. 2382-2386.

Ajay Dholakia, et al., "Capacity-Approaching Codes for the Magnetic Recording Channel," IBM Research Report, Oct. 28, 2002.

Hideki Imai, et al., "Generalized Tensor Product Codes," IEEE Transactions on Information Theory, vol. IT-27, No. 2, Mar. 1981, pp. 181-187.

Z. A. Keirn, et al., "Use of Redundant Bits for Magnetic Recording: Single-Parity Codes and Reed-Solomon Error Correcting Code," IEEE Transactions on Magnetics, vol. 40, No. 1, Jan. 2004, pp. 225-230.

Mauro Lattada, et al., "Improving DVB-T Forward Error Correction by Concatenated Turbo Code Scheme," from http://www.polytech.univ-nantes.fr/pv2003/papers/pv/papers/cr1040.pdf.

Alberto Torres, et al., "Inclusion of Concatenated Convolutional Codes in the ANSI T1.413 Issue 3," http://www.vocal.com/white_paper/t1e1301.pdf, Nov. 30-Dec. 4, 1998, pp. 1-12.

Alberto Torres, et al., Comparison of Simulated Results for Different Coding Techniques(Uncoded, Reed-Solomon, Reed-Solomon plus Trellis and Reed-Solomon plus Parallel Concatenated Convolutional Codes) for G.992.1 bis and G.992.2.bis, ITU—Telecommunication Standardization Sector, May 10-14, 1999.

Jun Xu, et al., "On Products of Graphs for LDPC Codes," Information Theory Workshop 2003, Paris, France, Mar. 31-Apr. 4, 2003, pp. 6-9.

J. K. Wolf, "Error-Locating Codes—A New Concept in Error Control," IEEE Transactions on Information Theory, 1963, pp. 113-117.

J. K. Wolf, "On Codes Derivable from the Tensor Product of Check Matrices," IEEE Transactions on Information Theory, 1965, pp. 281-284.

* cited by examiner $$H_{RSTP} = \begin{bmatrix}
1 & 0 & 0 & 1 & 0 & 0 & 1 & 0 & 0 & 1 & 0 & 0 & 1 & 0 & 0 & 1 & 0 & 0 & 1 & 0 & 0 \\
0 & 1 & 0 & 0 & 1 & 0 & 0 & 1 & 0 & 0 & 1 & 0 & 0 & 1 & 0 & 0 & 1 & 0 & 0 & 1 & 0 \\
0 & 0 & 1 & 0 & 0 & 1 & 0 & 0 & 0 & 0 & 0 & 0 & 0 & 0 & 0 & 0 & 0 & 1 & 0 & 0 & 1 \\
1 & 0 & 0 & 0 & 0 & 1 & 0 & 1 & 0 & 1 & 1 & 0 & 1 & 1 & 0 & 1 & 0 & 1 & 0 & 1 & 0 \\
0 & 1 & 0 & 1 & 0 & 0 & 0 & 0 & 0 & 0 & 1 & 0 & 1 & 1 & 0 & 1 & 1 & 0 & 1 & 0 & 1 \\
0 & 0 & 1 & 0 & 1 & 1 & 1 & 1 & 0 & 1 & 1 & 0 & 1 & 0 & 0 & 0 & 1 & 0 & 1 & 0 & 0 \\
1 & 1 & 1 & 1 & 1 & 1 & 0 & 0 & 0 & 1 & 1 & 1 & 1 & 1 & 1 & 0 & 0 & 0 & 0 & 0 & 0 \\
1 & 1 & 1 & 1 & 1 & 1 & 1 & 1 & 1 & 0 & 0 & 0 & 0 & 0 & 0 & 1 & 1 & 1 & 0 & 0 & 0 \\
1 & 1 & 1 & 0 & 0 & 0 & 1 & 1 & 1 & 1 & 1 & 1 & 0 & 0 & 0 & 0 & 0 & 0 & 1 & 1 & 1
\end{bmatrix}$$

Rows 1–6: 201. Rows 7–9: 202. Each column group has width 3. Dummy Bits indicated in columns 9, 12, 15.

FIG. 2

$$H_{RSTP} = \begin{bmatrix}
1 & 0 & 0 & 1 & 0 & 0 & 1 & 0 & 0 & 1 & 0 & 0 & 1 & 0 & 0 & 0 & 1 & 0 & 0 & 0 & 1 & 0 & 0 & 0 \\
0 & 1 & 0 & 0 & 1 & 0 & 0 & 1 & 0 & 0 & 1 & 0 & 0 & 1 & 0 & 0 & 0 & 1 & 0 & 0 & 0 & 1 & 0 & 0 \\
0 & 0 & 1 & 0 & 0 & 1 & 0 & 0 & 1 & 0 & 0 & 1 & 0 & 0 & 1 & 0 & 0 & 0 & 1 & 0 & 0 & 0 & 1 & 0 \\
1 & 0 & 0 & 0 & 0 & 1 & 0 & 1 & 1 & 1 & 1 & 1 & 1 & 1 & 0 & 0 & 1 & 0 & 1 & 0 & 0 & 1 & 0 & 0 \\
0 & 1 & 0 & 1 & 0 & 0 & 0 & 0 & 1 & 1 & 1 & 1 & 1 & 1 & 0 & 0 & 1 & 1 & 0 & 0 & 1 & 0 & 1 & 0 \\
0 & 0 & 1 & 0 & 1 & 1 & 1 & 1 & 1 & 1 & 1 & 0 & 1 & 0 & 1 & 0 & 0 & 1 & 0 & 0 & 1 & 0 & 0 & 0 \\
1 & 1 & 1 & 1 & 1 & 1 & 0 & 0 & 0 & 1 & 1 & 1 & 1 & 1 & 1 & 1 & 0 & 0 & 0 & 0 & 0 & 0 & 0 & 0 \\
1 & 1 & 1 & 1 & 1 & 1 & 1 & 1 & 1 & 0 & 0 & 0 & 0 & 0 & 0 & 0 & 1 & 1 & 1 & 1 & 0 & 0 & 0 & 0 \\
1 & 1 & 1 & 0 & 0 & 0 & 1 & 1 & 1 & 1 & 1 & 1 & 0 & 0 & 0 & 0 & 0 & 0 & 0 & 0 & 1 & 1 & 1 & 1
\end{bmatrix}$$

Rows 1–6: 401. Rows 7–9: 402. Column group widths: 3, 3, 3, 3, 4, 4, 4. Dummy Bits indicated in the last three groups.

FIG. 4

REDUCED COMPLEXITY ERROR CORRECTION ENCODING TECHNIQUES

FIELD OF THE INVENTION

The present invention relates to techniques for performing error correction encoding in data recording systems, and more particularly, to techniques for performing error correction encoding using error correction codes that are less computationally intensive.

BACKGROUND OF THE INVENTION

Error correcting codes are used in data recording systems to ensure data reliability. Parity codes are examples of error correction codes. Parity codes are often used to correct randomly occurring errors.

Short parity codes typically provide good error correction performance, but at a low code rate. Longer parity codes provide a higher code rate. However, high rate parity codes typically have reduced error correction performance and are more likely to propagate errors.

These deficiencies can be overcome by using a tensor product parity code or codes modified from a tensor product code. A tensor product parity (TPP) code is the tensor product of two smaller codes. The parity check matrix of a TPP code is derived by taking the tensor product of the parity check matrices for the two smaller codes.

For example, a tensor product parity code can be the tensor product of a short parity code and a component Bose-Chaudhuri-Hochquenghem (BCH) code. Such a tensor product parity code has an error correction performance equivalent to a short parity code, but with a substantially higher code rate. BCH codes are another well-known family of error correcting codes. The component BCH code can be replaced by any other error correction codes.

A Reed-Solomon (RS) error correction code can be combined with a tensor product parity (TPP) code to generate a combined code. The combined code can be used to provide two levels of error correction in a data recording system. While efficient encoding methods exist for encoding the TPP and RS codes separately, no such efficient encoder exists to simultaneously enforce both TPP and RS parity rules. The only method known to encode a combination RS and TPP code is by brute-force matrix multiply. Combined RS/TPP codes typically have very large parity check matrices, and as a result, they are difficult to encode, because they require extensive matrix multiplication.

It would therefore be desirable to provide combined error correcting codes that are simpler to encode and that require less extensive matrix multiplication.

BRIEF SUMMARY OF THE INVENTION

The present invention provides systems and methods for performing error correction encoding using error correction codes. The error correction encoding techniques of the present invention have a reduced complexity that allows them to be applied to practical data recording systems.

An encoder inserts redundant parity information into a data stream to improve system reliability. According to one embodiment, the encoder can generate the redundant parity information by combining two component codes. Dummy bits are inserted into the data stream in locations reserved for parity information generated by subsequent encoding. The redundant parity information can be generated by applying encoders for each component code successively such that data and parity information from all of the preceding encoders are input into a subsequent encoder.

An error correction code of the present invention can have a uniform or a non-uniform span. The span corresponds to consecutive channel bits that are within a single block of a smaller parity code that is used to form a composite code. The span lengths can be variant across the whole codeword by inserting dummy bits in less than all of the spans.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 2 illustrates a parity check matrix for a composite code, combining a RS code and a TPP code, having dummy bits for the RS code and a uniform span TPP code according to an embodiment of the present invention.

FIG. 4 illustrates another parity check matrix for a composite code, combining a RS code and a TPP code, that has dummy bits for the RS code and a non-uniform span according to another embodiment of the present invention.

DETAILED DESCRIPTION OF THE INVENTION

Figure 1:
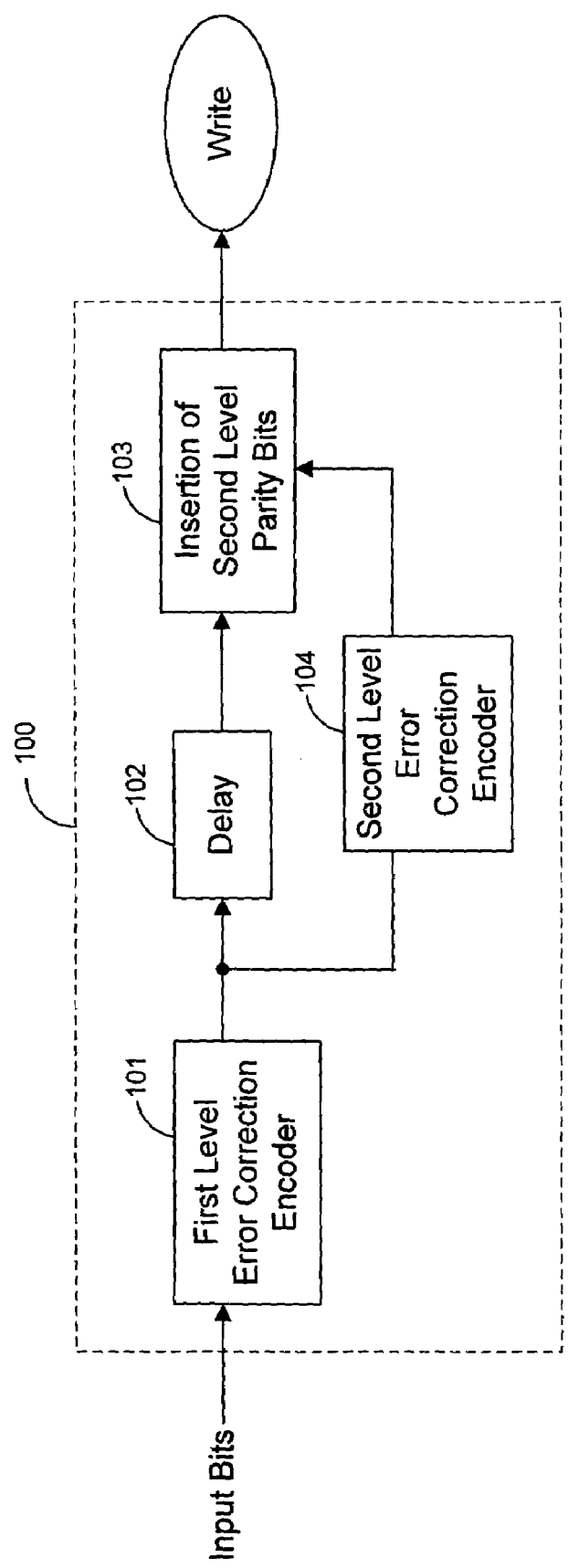
FIG. 1 illustrates a two level error correction encoder according to an embodiment of the present invention.

In many data storage or communications systems, two separate codes are combined to form a composite code. The most common method of combining two component codes is simple concatenation. In simple concatenation, the composite codeword consists of a sequence of smaller blocks. Each of the smaller blocks is a codeword of an inner component code. The sequence of blocks is a codeword of an outer component code. Simple concatenation combines two component codes to form a composite code that has stronger error correcting capabilities than either component code. However, the composite code incurs the parity overhead of both component codes.

Encoding proceeds by first encoding the data blocks using the outer component code by adding outer parity blocks. Then, every block is encoded using the inner component code by adding inner parity bits within each block.

Decoding proceeds by first decoding each block using the inner component code decoder. The inner component code decoder corrects all errors in blocks with only a few bits in error. The resulting sequence of blocks is then decoded using the outer component code decoder. The outer component code decoder corrects blocks that were decoded incorrectly by the inner component code decoder.

Another method for combining two component codes known in the prior art is generalized concatenation. As with simple concatenation, the composite codeword consists of a sequence of smaller blocks. The blocks are not codewords of the inner component code. The degree to which each block deviates from the parity rules of the inner component code is called the syndrome for that block. The outer component code does not operate over the sequence of blocks as such, but rather the sequence of syndromes is a codeword of the outer component code.

Encoding proceeds by computing the inner component code syndrome for blocks corresponding to data elements of the outer component code. The outer component code encoder then computes the syndromes required for the remaining blocks in order for the complete sequence of syndromes to form a valid codeword of the outer component code. These remaining blocks correspond to parity elements of the outer component code. For the remaining blocks, parity bits are added to force the syndrome to the required value.

Decoding proceeds by first computing the inner block syndrome for each block. The sequence of syndromes is then decoded using the outer component code decoder. Each block is then decoded again using the inner component code decoder and the corresponding syndrome value given by the outer component code decoder.

According to an embodiment of the present invention, three component codes are combined to form a composite code. First, two codes are combined by generalized concatenation to form a first composite code. The first composite code is then used as the inner code in simple concatenation with an outermost error correction code to form a second composite code.

In the preferred embodiment, a simple parity code is concatenated with a BCH code to form a composite tensor product parity code that is then concatenated with a Reed-Solomon outermost error correction code. It should be understood that the principles of the present invention can encode data using composite codes formed by combining different component codes in a similar fashion.

A composite code formed in this way cannot easily be encoded. This difficulty arises due to the fact that both the composite code formed by generalized concatenation and the outermost error correcting code involve parity checks that span the entire codeword. The present invention describes how simple modifications to the details of the concatenation can render the encoding problem more tractable.

FIG. 1 illustrates an error correction encoder 100 for a data recording system according to an embodiment of the present invention. Error correction encoder 100 of FIG. 1 generates redundant bits that are used for error detection and/or error correction in data recording systems such as magnetic hard disk drives, optical disks, and a variety of other recording media. The error correction techniques of the present invention can also be used in data transmission applications.

Input data bits are provided to a first level error correction encoder 101. Error correction encoder 101 can apply any error correction or detection code to the input data bits to generate redundant data bits. For example, first level error correction encoder 101 can be a Reed-Solomon (RS) encoder that generates RS check bytes for each block of input data.

The data output blocks of encoder 101 include RS check bytes. Data output blocks of encoder 101 are provided to delay block 102 and second level error correction encoder 104. According to one embodiment of the present invention, second level error correction encoder 104 uses a tensor product parity code (TPPC) to generate a second level of redundant parity bits.

Second level encoder 104 generates a set of redundant parity bits for each block of input data using a composite code, such as a tensor product parity (TPP) code. The parity bits are then inserted into the data block at block 103.

Delay block 102 delays the output data block of encoder 101 so that encoder 104 has enough time to calculate the parity bits and to insert the parity bits into the same data block before the data is written onto a recording medium.

FIG. 2 illustrates one example of a parity check matrix $H_{RSTP}$ for a composite code that can be used to implement error correction encoding according to the present invention. Parity check matrix $H_{RSTP}$ shown in FIG. 2 is generated by combining a parity check matrix 201 for a bit-wise shortened RS code and a parity check matrix 202 for a tensor product parity (TPP) code. It should be understood that the techniques of the present invention can be applied to many types of composite codes, and that the parity check matrices described herein are merely examples used to illustrate the present invention.

The span of the code corresponding to the $H_{RSTP}$ matrix is the granularity length of each TPP inner component code. In the example of FIG. 2, the matrix has a uniform (or fixed) span of 3 throughout the code block. It should be understood that the techniques of the present invention apply to codes of any span and any size.

The example parity check matrix $H_{TPP}$ 202 for the TPP code is the tensor product of a parity check matrix $H_1$ for a single parity code and a parity check matrix $H_2$ for a BCH code. The parity check matrix $H_{TPP}$ 202 shown in FIG. 2 is generated by taking the tensor product of the following check matrices $H_1$ and $H_2$.

$$H_1 = [1, 1, 1]$$

$$H_2 = \begin{bmatrix} 1101100 \\ 1110010 \\ 1011001 \end{bmatrix}$$

The check matrix $H_1$ corresponds to a (3, 2) single parity code, and the check matrix $H_2$ corresponds to a (7, 4) BCH code. Parity check matrix $H_{TPP}$ 202 is shown below.

$$H_{TPP} = \begin{bmatrix} 1 & 1 & 1 & | & 1 & 1 & 1 \\ 1 & 1 & 1 & | & 1 & 1 & 1 \\ 1 & 1 & 1 & | & 0 & 0 & 0 \end{bmatrix}$$

$$\begin{bmatrix} 0 & 0 & 0 & | & 1 & 1 & 1 & | & 1 & 1 & 1 & | & 0 & 0 & 0 & | & 0 & 0 & 0 \\ 1 & 1 & 1 & | & 0 & 0 & 0 & | & 0 & 0 & 0 & | & 1 & 1 & 1 & | & 0 & 0 & 0 \\ 1 & 1 & 1 & | & 1 & 1 & 1 & | & 0 & 0 & 0 & | & 0 & 0 & 0 & | & 1 & 1 & 1 \end{bmatrix}$$

The tensor product parity check matrix $H_{TTP}$ can be expressed as two levels of equations using modulo 2 arithmetic. The first level equations are tensor local parity equations that are based on the $H_1$ parity check matrix. The first level equations are used to generate intermediate values $a_i$, where $i=1, 2, 3, \ldots m$, and m is the number of columns in the $H_2$ matrix. Using the example $H_1$ matrix given above, first level equations can be expressed as shown in equations (1)-(7), where + represents modulo 2 addition (an XOR function).

$$a_1 = x_1 + x_2 + x_3 \tag{1}$$

$$a_2 = x_4 + x_5 + x_6 \tag{2}$$

$$a_3 = x_7 + x_8 + x_9 \tag{3}$$

$$a_4 = x_{10} + x_{11} + x_{12} \tag{4}$$

$$a_5 = x_{13} + x_{14} + x_{15} \tag{5}$$

$$a_6 = x_{16} + x_{17} + x_{18} \tag{6}$$

$$a_7 = x_{19} + x_{20} + x_{21} \quad (7)$$

The second level equations are global parity equations that are based on the $H_2$ parity check matrix. Each of the second level equations corresponds to one row in the $H_2$ matrix. Using the example $H_2$ matrix given above and the example equations (1)-(7), second level equations can expressed as shown in equations (8)-(10), where + represents modulo 2 addition.

$$a_1 + a_2 + a_4 + a_5 = 0 \quad (8)$$

$$a_1 + a_2 + a_3 + a_6 = 0 \quad (9)$$

$$a_1 + a_3 + a_4 + a_7 = 0 \quad (10)$$

The parity check matrix 201 in FIG. 2 is based on a bit-wise shortened Reed-Solomon code. The $9^{th}$, $12^{th}$, and $15^{th}$ columns of parity check matrix 201 contain zero entries and corresponds to dummy bits for the bit-wise shortened RS code. These zero values indicate that bit positions 9, 12 and 15 are not checked by the RS code. In other words, they are equivalent to zero bits for the RS code. In the RS encoder circuits, the data corresponding to bit positions 9, 12 and 15 are set to dummy values of zero.

TPP check matrix 202 contains three columns of parity bits. The $9^{th}$, $12^{th}$, and $15^{th}$ columns in matrix 202 contain the parity bits for the TPP code. The dummy bits in matrix 201 are in the same three columns as the parity bits in matrix 202. Unlike many prior art systems, an RS decoder of the present invention does not check the TPP parity bits. This means that the RS code can be encoded independent of the TPP code.

A parity check matrix completely describes any linear block code. Furthermore, by applying simple algebraic manipulation known to persons skilled in the art, a parity check matrix can be transformed into a generator matrix. A generator matrix can be used to encode data into a codeword that satisfies the parity check rules described in the parity check matrix. Encoding by matrix multiplication is not preferred. For the most common codes, more efficient encoders exist that do not require large matrix multiplications.

Codes used for real hard disk drives are much larger than the example codes shown in FIG. 2. The dummy bits in matrix 201 act as place holders that greatly reduce the complexity of the computations performed using the $H_{RSTP}$ matrix. As a result, the present invention requires less latency time and a smaller chipset to perform the error correction encoding.

Figure 3:
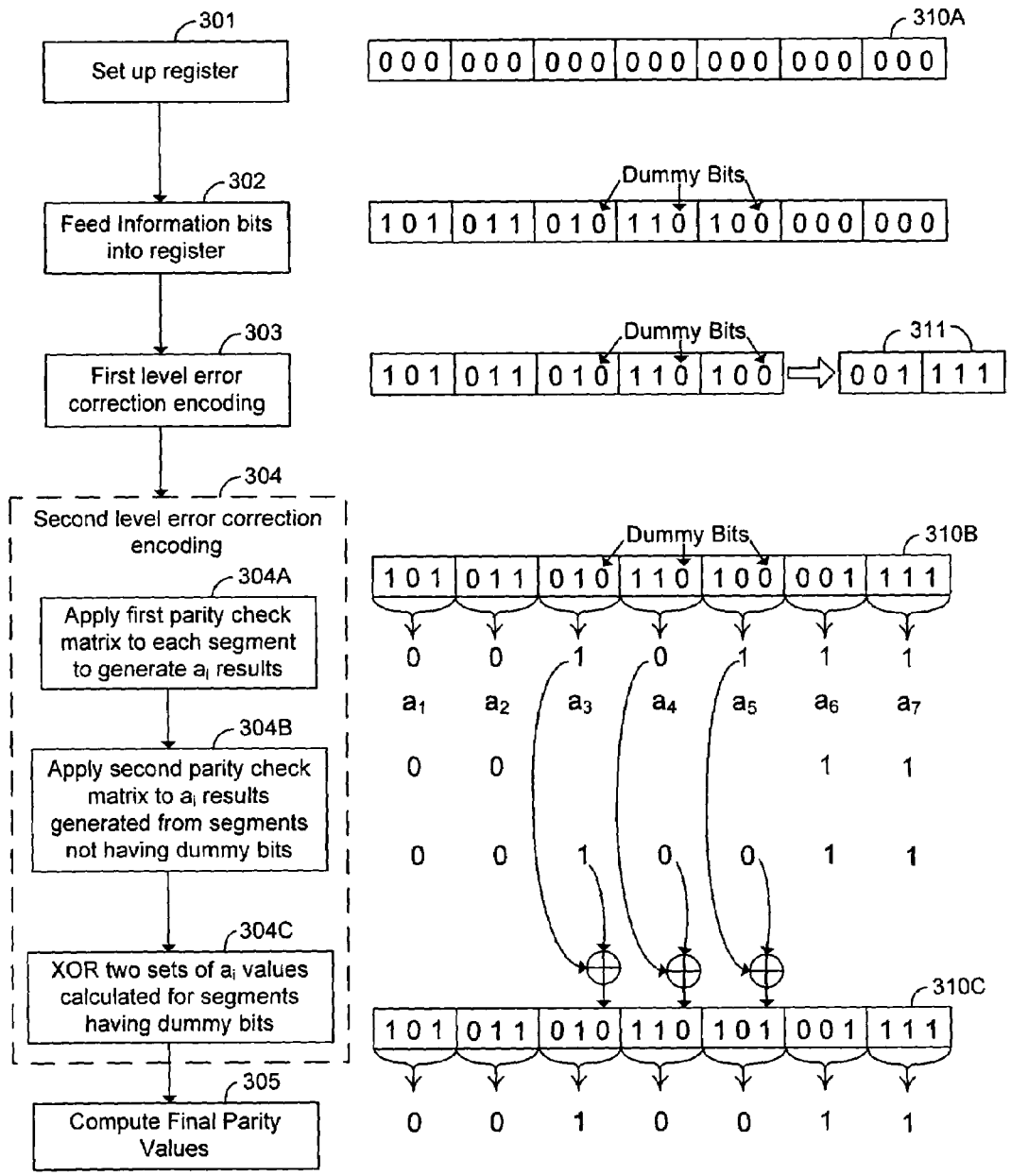
FIG. 3 illustrates an example of a process for encoding bits using a composite code having a uniform span according to an embodiment of the present invention.

FIG. 3 illustrates a process for encoding bits with a composite code according to an embodiment of the present invention. The example illustrated in FIG. 3 is a toy example using codes much smaller than codes used in typical hard disk drive systems. A shift register 310A is shown in FIG. 3 to illustrate the present invention. Each portion of the register has enough space to store one segment of 3 bits.

The number of bits in each segment equals the span length. In the example of FIGS. 2 and 3, the span length of every segment is 3, which is based on the span of the $H_1$ matrix. Because every segment in this example has the same span length, the span is uniform.

At step 301, register 310A is set up, for example, by setting the values stored in the register to zero. The register stores input bits. A set of 12 input bits (e.g., 101011011110) is serially shifted into the register from left to right at step 302. None of the 12 input bits are stored in the $9^{th}$, $12^{th}$, and $15^{th}$ bit positions of the shift register. Instead, three zero-value dummy bits are stored in these 3 bit positions. The last two segments of the register remain empty.

At step 303, a first level of error correction encoding is performed. The result of the first level of error correction encoding is a set of redundant bits that is added to the set of input bits. For example, the first level of error correction encoding can be Reed-Solomon (RS) encoding. RS parity data can be efficiently generated by recursive methods well known in the prior art. In FIG. 3, two redundant RS check bytes 311 are generated and added to the set of bits to generate a RS codeword.

At step 304, a second level of error correction encoding is performed using a composite code to compute additional parity bits. In the example of FIGS. 2 and 3, the second level encoder uses a tensor product parity code (TPPC) as the composite code. The parity bits are stored in the dummy bit locations (e.g., the $9^{th}$, $12^{th}$, and 15 bit positions of the register in the example of FIG. 3). The parity and dummy bits can be stored in any bit locations, except in the RS check bytes.

The second level encoding is performed in three steps in the example of FIG. 3. In the first step 304A, the first component code based on parity check matrix $H_1$ is applied to each segment of bits in the codeword to compute intermediate results $a_i$. For example, equations (1)-(7) can be applied to the 7 three-bit data segments stored in register 310B to generate intermediate results $a_1, a_2, a_3, \ldots, a_7 = 0010111$. Equations (1)-(7) indicate whether each segment of 3-bits in the codeword has an even (0) or an odd (1) number of 1 bits.

In the second step 304B of second level encoding, the second component code encoder generates new intermediate values $a_3'$, $a_4'$, and $a_5'$ such that $a_1, a_2, a_3', a_4', a_5', a_6, a_7$ satisfy parity check matrix $H_2$. In this example, the inputs to the second component code encoder are intermediate values $a_1$, $a_2$, $a_6$, and $a_7$, and the outputs are $a_3'$, $a_4'$, and $a_5'$. In general, the inputs are the intermediate values generated by segments that do not contain a dummy bit, and the outputs correspond to segments that do contain a dummy bit.

In the third step 304C of second level encoding, the final parity bits for the composite code are generated by applying modulo 2 addition (XOR) to the two sets of $a_i$ values calculated for the segments with dummy bits. For example, in FIG. 3, the intermediate values $a_i$ calculated from the segments with dummy bits using the encoder for the first component code are $a_3$-$a_5$. The new values for $a_3'$, $a_4'$, and $a_5'$ computed by the encoder for the second component code encoder are XOR'ed with corresponding values for $a_3$, $a_4$, and $a_5$ computed using the first component code.

In the example of FIG. 3, the values computed for a3-a5 using the encoder for the first component code are 101, and the values computed for a3'-a5' using the second component code are 100. Bits 101 are XOR'ed with corresponding bits 100 to generate final TPP parity bit values 001, as shown in 310C in FIG. 3 next to step 304C. At step 305, final parity values are computed.

The present invention provides significant benefits to data recording media, including hard disk drives. Specifically, the error encoding techniques of the present invention use dummy bits in the encoding process to simplify the computations. The encoding techniques of the present invention are simple enough that they can be performed using encoders designed for two or more codes that are used to form a composite code. For the toy example shown in FIGS. 2 and 3, encoders of the RS code and the TPP code are used in the two levels of the encoding procedure, respectively.

The present invention reduces the size of the chipset required to perform the encoding. The present invention also reduces the latency in the controller electronics.

FIG. 4 illustrates another example of a parity check matrix $H_{RSTP}$ for a composite that can be used to implement error correction encoding according to the present invention. The parity check matrix of FIG. 4 has a non-uniform span that corresponds to the non-uniform span of the code $C_{RSTP}$.

The parity check matrix $H_{RSTP}$ shown in FIG. 4 is generated by combining a parity check matrix 401 and a parity check matrix 402. Parity check matrix 401 is based on a full Reed-Solomon (RS) code, and parity check matrix 402 is modified from a tensor product parity (TPP) code.

Three additional columns are added to the RS parity check matrix 401 corresponding to three dummy bits per row, as shown in FIG. 4. These three columns of dummy bits act as place holders for the parity bits generated by the TPP code encoder. The TPP code parity bits are located in the same 3 columns as the dummy bits.

The span of the TPP component code is variant in the example of FIG. 4. The extra columns added to accommodate the dummy bits and TPP code parity bits cause the parity check matrix $H_{RSTP}$ of FIG. 4 to have a non-uniform span. The span of the first four segments is 3, and the span of the next three segments is 4, as shown in FIG. 4.

Figure 5:
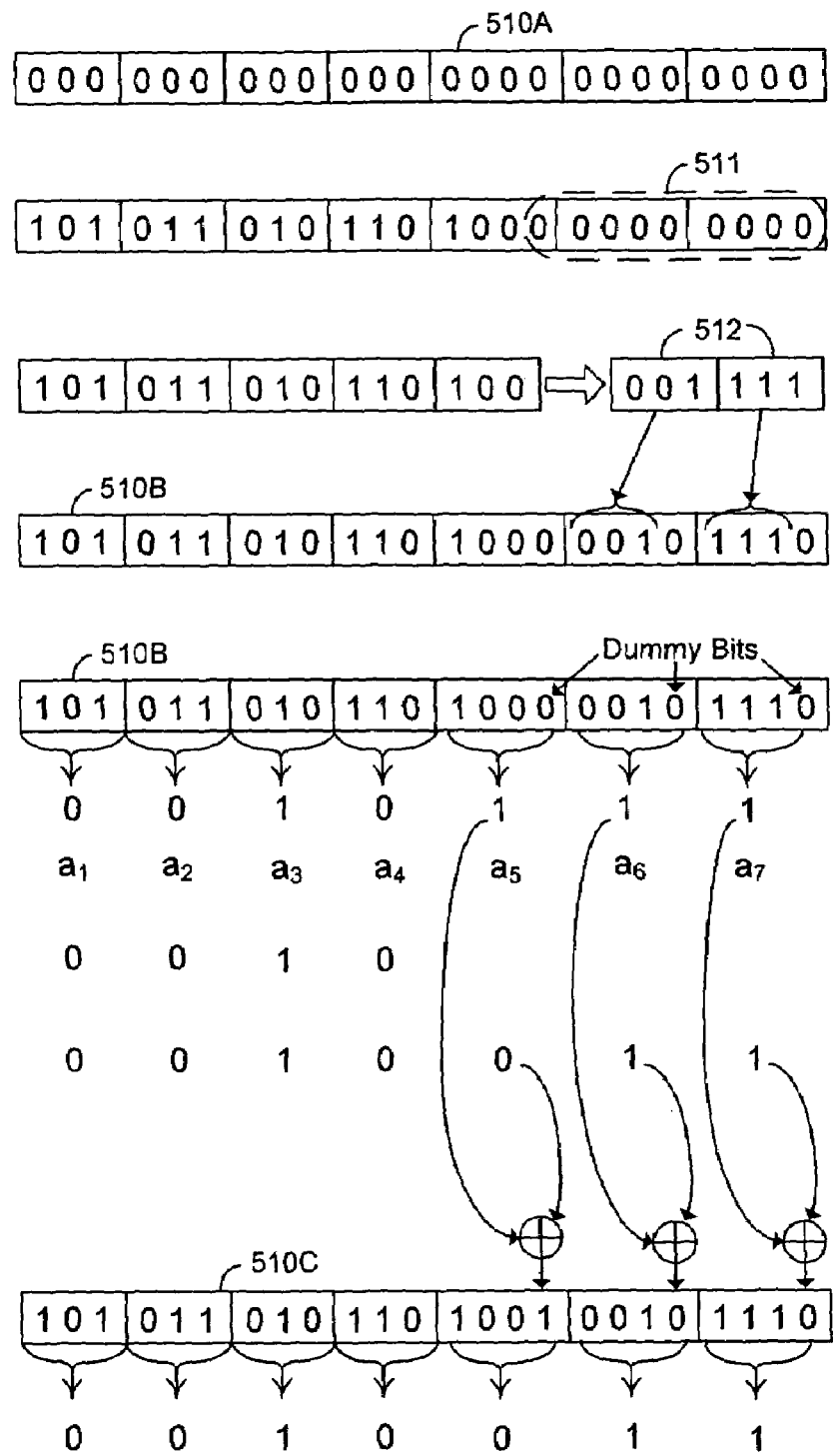
FIG. 5 illustrates an example of a process for encoding bits using a composite code having a non-uniform span according to an embodiment of the present invention.

FIG. 5 illustrates an example of how bits can be encoded with a composite code having a non-uniform span, according to an embodiment of the present invention. Error correction encoding can be performed on blocks of data stored in shift register 510. After register 510A is cleared, 15 information bits are shifted into the register. Information bits are not loaded into the last 9 spaces 511. These 9 spaces remain empty.

First level error correction encoding (e.g., RS encoding) is then performed to generate first level redundant check bytes 512. The redundant check bytes are loaded into the last two segments of register 510B as shown in FIG. 5. The last three segments having a span of four each have one dummy bit (0). The dummy bits are the last bits in each of these three segments.

The second level of error correction encoding is performed using a composite code (e.g., a tensor product parity code) to compute the parity bits. In the example of FIGS. 4 and 5, the parity bits are stored in the dummy bit locations of the codeword.

The first component code encoder is applied to each segment of bits in the codeword to compute intermediate results $a_{1-7}$. Subsequently, the second component code encoder is applied to the intermediate results $a_i$ computed using the segments that do not contain a dummy bit.

In the example of FIG. 5, the values generated for $a_1$, $a_2$, $a_3$, and $a_4$ are substituted into equations (8)-(10) to generate a second set of values for $a_5'$, $a_6'$, and $a_7'$. This second set of values $a_5'$, $a_6'$, and $a_7'$ are XOR'ed with the corresponding values for $a_5$, $a_6$, and $a_7$ computed using the first component code.

The results of these three XOR functions are the correct parity values for the second level composite code. The correct parity values are inserted into the codeword stored in register 510C to replace the dummy bits, as shown in FIG. 5. Final parity values can be computed for each segment using the non-uniform span first parity check matrix.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

What is claimed is:

1. A data storage apparatus for recording data on a storage medium, the data storage apparatus comprising:
    means for encoding input bits using a first error correction code to generate first redundant bits that are combined with the input bits to generate a codeword, wherein dummy bits are located among bits in the codeword;
    means for encoding segments of bits in the codeword using a first component code of an error correction composite code to generate first intermediate values;
    means for encoding segments of bits in the codeword that do not contain one of the dummy bits using a second component code of the error correction composite code to generate second intermediate values;
    means for applying a logic function to the first and the second intermediate values to generate second redundant bits of the error correction composite code; and
    means for inserting the second redundant bits into the codeword to replace the dummy bits.

2. The data storage apparatus defined in claim 1 further comprising:
    means for computing final parity values for each of the segments in the codeword using the first and the second redundant bits.

3. The data storage apparatus defined in claim 1 wherein the data storage apparatus is a hard disk drive.

4. The data storage apparatus defined in claim 1 wherein the means for encoding segments of bits in the codeword using a first component code of an error correction composite code to generate the first intermediate values further comprises means for encoding segments of bits in the codeword using the first component code of the error correction composite code having a non-uniform span to generate the first intermediate values.

5. The data storage apparatus defined in claim 1 wherein the means for encoding segments of bits in the codeword using a first component code of an error correction composite code to generate the first intermediate values further comprises means for encoding segments of bits in the codeword using the first component code of a tensor product parity code to generate the first intermediate values.

6. The data storage apparatus defined in claim 1 wherein the means for encoding input bits using a first error correction code to generate first redundant bits that are combined with the input bits to generate a codeword further comprises means for encoding the input bits using a Reed-Solomon code to generate the first redundant bits.

7. The data storage apparatus defined in claim 1 wherein the means for encoding segments of bits in the codeword using a first component code of an error correction composite code to generate the first intermediate values further comprises means for encoding segments of bits in the codeword using the first component code of the error correction composite code that has parity bits stored in the same bit locations in the codeword as the dummy bits.

8. The data storage apparatus defined in claim 1 wherein the means for applying a logic function to the first and the second intermediate values to generate second redundant bits of the error correction composite code further comprises means for applying modulo 2 addition to the first and the second intermediate values to generate the second redundant bits of the error correction composite code.

9. The data storage apparatus defined in claim 1 wherein the means for encoding segments of bits in the codeword using a first component code of an error correction composite code to generate the first intermediate values further comprises means for encoding segments of bits in the codeword using a single parity code to generate the first intermediate values.

10. The data storage apparatus defined in claim 9 wherein the means for encoding segments of bits in the codeword that do not contain one of the dummy bits using a second component code of the error correction composite code to generate second intermediate values further comprises means for encoding segments of bits in the codeword that do not contain one of the dummy bits using a Bose-Chaudhuri-Hochquenghem code to generate the second intermediate values.

* * * * *